(12) United States Patent
Jang et al.

(10) Patent No.: US 7,772,683 B2
(45) Date of Patent: Aug. 10, 2010

(54) STACKED INTEGRATED CIRCUIT PACKAGE-IN-PACKAGE SYSTEM

(75) Inventors: Ki Youn Jang, Ichon-si (KR); Jong-Woo Ha, Seoul (KR); Jong Wook Ju, Icheon-Si (KR)

(73) Assignee: Stats Chippac Ltd., Singapore (SG)

( * ) Notice: Subject to any disclaimer, the term of this patent is extended or adjusted under 35 U.S.C. 154(b) by 300 days.

(21) Appl. No.: 11/608,827

(22) Filed: Dec. 9, 2006

(65) Prior Publication Data
US 2008/0136006 A1 Jun. 12, 2008

(51) Int. Cl.
*H01L 23/02* (2006.01)
(52) U.S. Cl. ........................... 257/685; 257/686
(58) Field of Classification Search ........... 257/685, 257/686
See application file for complete search history.

(56) References Cited

U.S. PATENT DOCUMENTS

| | | | |
|---|---|---|---|
| 5,309,026 | A | 5/1994 | Matsumoto |
| 5,854,507 | A | 12/1998 | Miremadi et al. |
| 6,353,265 | B1 | 3/2002 | Michii |
| 6,414,396 | B1 * | 7/2002 | Shim et al. ............ 257/778 |
| 6,445,064 | B1 * | 9/2002 | Ishii et al. ............ 257/686 |
| 6,627,480 | B2 | 9/2003 | Kim |
| 6,686,656 | B1 * | 2/2004 | Koh et al. ............ 257/686 |
| 7,061,087 | B2 | 6/2006 | Kim |
| 7,071,547 | B2 | 7/2006 | Kang et al. |
| 7,078,264 | B2 | 7/2006 | Yang |
| 7,105,919 | B2 | 9/2006 | Kim |
| 7,116,002 | B2 | 10/2006 | Chao et al. |
| 2002/0079570 | A1 | 6/2002 | Ho et al. |
| 2005/0067694 | A1 | 3/2005 | Pon et al. |
| 2006/0189033 | A1 | 8/2006 | Kim |
| 2007/0278643 | A1 | 12/2007 | Yee |
| 2008/0006925 | A1 | 1/2008 | Yim et al. |
| 2008/0029866 | A1 | 2/2008 | Kim et al. |
| 2008/0029867 | A1 | 2/2008 | Kim et al. |

* cited by examiner

*Primary Examiner*—Zandra Smith
*Assistant Examiner*—Paul E Patton
(74) *Attorney, Agent, or Firm*—Mikio Ishimaru

(57) ABSTRACT

A stacked integrated circuit package-in-package system is provided including forming a substrate having a top surface and a bottom surface, mounting a first device over the top surface, stacking a second device over the first device in an offset configuration, connecting a first internal interconnect between the first device and the bottom surface, connecting a second internal interconnect between the second device and the bottom surface, and encapsulating the first device and the second device.

17 Claims, 4 Drawing Sheets

STACKED INTEGRATED CIRCUIT PACKAGE-IN-PACKAGE SYSTEM

CROSS-REFERENCE TO RELATED APPLICATIONS

The present application contains subject matter related to concurrently filed U.S. patent application Ser. No. 11/608,829 by Ohsug Kim, Jong-Woo Ha, and Jong Wook Ju entitled "Stacked Integrated Circuit Package-in-Package System". The related application is assigned to STATS ChipPAC Ltd.

The present application contains subject matter related to concurrently filed U.S. patent application Ser. No. 11/608,826 by Hun Teak Lee, Tae Keun Lee, and Soo Jung Park entitled "Stackable Integrated Circuit Package System". The related application is assigned to STATS ChipPAC Ltd.

TECHNICAL FIELD

The present invention relates generally to integrated circuit packages and more particularly to stacked integrated circuit package-in-package system.

BACKGROUND ART

Electronics demand more integrated circuits in an integrated circuit package while paradoxically providing less physical space in the system for the increased integrated circuits content. Some technologies primarily focus on integrating more functions into each integrated circuit. Other technologies focus on stacking these integrated circuits into a single package. While these approaches provide more functions within an integrated circuit, they do not fully address the requirements for lower height, smaller space, and cost reduction.

Modern electronics, such as smart phones, personal digital assistants, location based services devices, servers, and storage arrays, are packing more integrated circuits into an ever-shrinking physical space with expectations for decreasing cost. Numerous technologies have been developed to meet these requirements. Some of the research and development strategies focus on new package technologies while others focus on improving the existing package technologies. Research and development in the existing package technologies may take a myriad of different directions.

One proven way to reduce cost is to use package technologies with existing manufacturing methods and equipments. Paradoxically, the reuse of existing manufacturing processes does not typically result in the reduction of package dimensions. Existing packaging technologies struggle to cost effectively meet the ever-demanding integration of today's integrated circuits and packages.

Numerous package approaches stack multiple integrated circuit dice or package in package (PIP) or a combination thereof. The electrical connections to the each of the stacked integrated circuit require an increased amount of space from by spacers, such as silicon or interposers, or by the space required for the electrical connections, such as wire loops for bond wires. Current spacers require additional steps and structures increasing manufacturing costs and decreasing manufacturing yields. These spacers also limit the amount of height reduction. Space required for the different electrical connection types limit the overall size, e.g. height, width, and length, of the package.

Thus, a need still remains for a stacked integrated circuit package-in-package system providing low cost manufacturing, improved yield, and decreased size for the integrated circuit package. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a stacked integrated circuit package-in-package system including forming a substrate having a top surface and a bottom surface, mounting a first device over the top surface, stacking a second device over the first device in an offset configuration, connecting a first internal interconnect between the first device and the bottom surface, connecting a second internal interconnect between the second device and the bottom surface, and encapsulating the first device and the second device.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
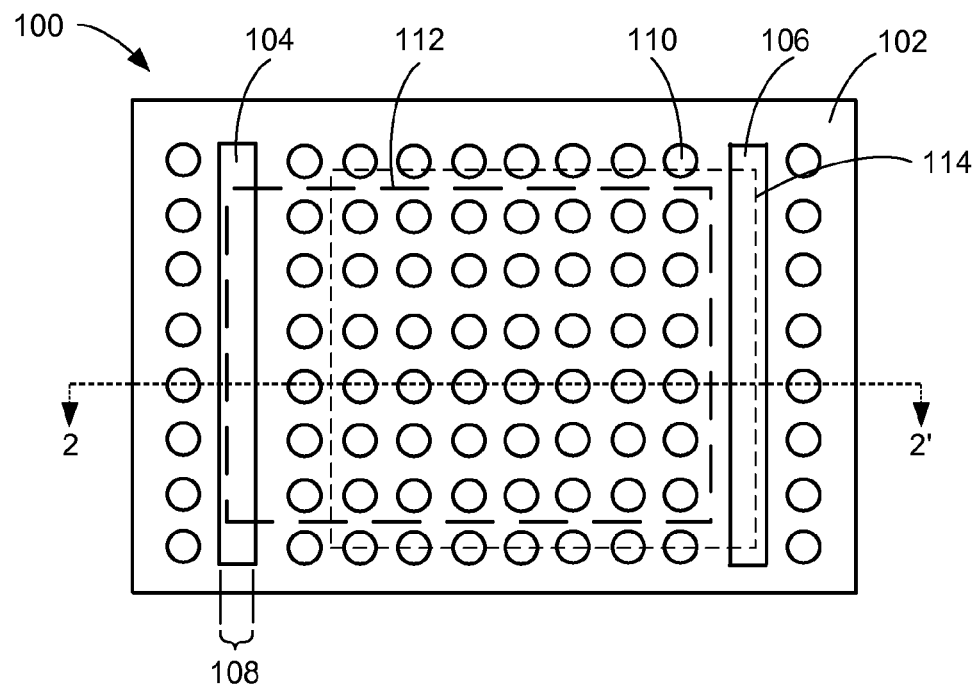
FIG. 1 is a plan view of a stacked integrated circuit package-in-package system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. In addition, where multiple embodiments are disclosed and described having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "processing" as used herein includes deposition of material or photoresist, patterning, exposure, development, etching, cleaning, and/or removal of the material or photoresist as required in forming a described structure. The term "system" as used herein means and refers to the method and to the apparatus of the present invention in accordance with the context in which the term is used.

Referring now to FIG. 1, therein is shown a plan view of a stacked integrated circuit package-in-package system 100 in an embodiment of the present invention. The stacked integrated circuit package-in-package system 100 includes a substrate 102, such as a laminate substrate, with a first opening 104 and a second opening 106. The first opening 104 and the second opening 106 has an opening width 108 in a range about hundreds to two thousand of micrometers. An array of external interconnects 110, such as solder balls, are between the first opening 104 and the second opening 106 in the substrate 102. A row of the external interconnects 110 is also in the substrate 102 at a side of each of the first opening 104 and the second opening 106 opposite the array of the external interconnects 110.

A first device 112, such as a packaged device or an integrated circuit die, is over the first opening 104 and the array of the external interconnects 110. A second device 114, such as a packaged device or an integrated circuit die, is in an offset configuration with the first device 112. The second device 114 is over the second opening 106 and partially over the array of the external interconnects 110.

For illustrative purposes, the first device 112 and the second device 114 are shown different sizes, although it is understood that the first device 112 and the second device 114 may not be different. Also for illustrative purposes, the first opening 104 and the second opening 106 are shown in the substrate 102, although it is understood that the number of openings and the configurations of the openings may differ. Further for illustrative purposes, the external interconnects 110 are shown in array and row configurations, although it is understood that the external interconnects 110 may be in different configurations.

Figure 2:
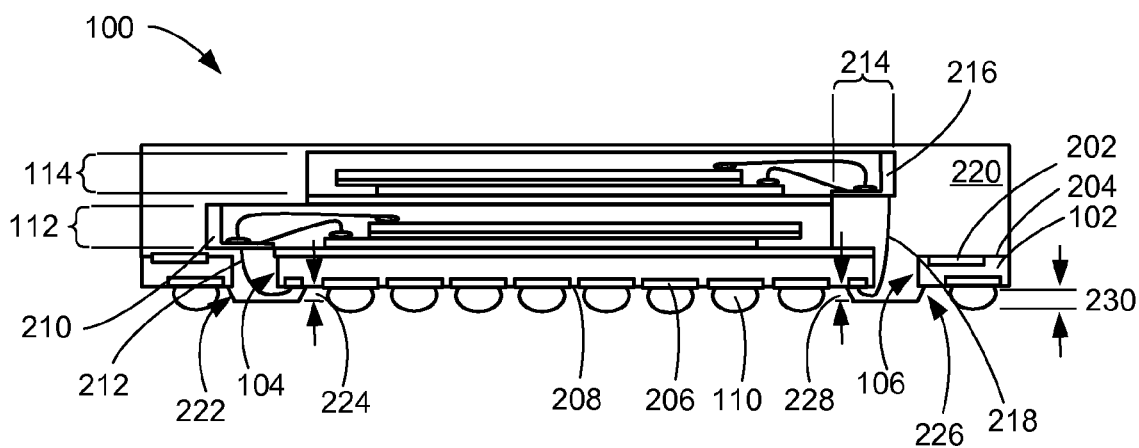
FIG. 2 is a cross-sectional view of the stacked integrated circuit package-in-package system along a line segment 2-2 of FIG. 1.

Referring now to FIG. 2, therein is shown a cross-sectional view of the stacked integrated circuit package-in-package system 100 along a line segment 2-2 of FIG. 1. The stacked integrated circuit package-in-package system 100 packs more devices while decreasing overall package size, simplifying manufacturing process, increasing yield, and reducing the overall cost through an offset stack configuration and a board on chip (BOC) configuration of the substrate 102.

The substrate 102 includes the first opening 104 and the second opening 106 in a BOC configuration. The substrate 102 includes top contacts 202 at a top surface 204 and bottom contacts 206 at a bottom surface 208. The external interconnects 110 attach to a portion of the bottom contacts 206. For illustrative purposes, the substrate 102 is shown as having the top contacts 202 and the bottom contacts 206, although it is understood that the substrate 102 may have other structures, such as one or more routing layers or electrical vias.

The first device 112 is over the top surface 204 and the first opening 104 while not covering the second opening 106. First terminals 210, such as terminal pads, of the first device 112 are over the first opening 104. First internal interconnects 212, such as bond wires, connect the first terminals 210 and the bottom contacts 206 next the first opening 104.

The second device 114 is stacked above the first device 112 in the offset configuration. The offset configuration provides an overhang 214 of the second device 114 over the first device 112. The overhang 214 exposes second terminals 216, such as terminal pads, of the second device 114. The overhang 214 provides a predetermined clearance from the first device 112 not to impede connections of second internal interconnects 218 to the second terminals 216. The second internal interconnects 218 also connect to the bottom contacts 206 next to the second opening 106.

A package encapsulation 220, such as an epoxy molding compound, covers the first device 112, the first internal interconnects 212, the second internal interconnects 218, and the top surface 204. The package encapsulation 220 also fills the first opening 104 forming a first bottom-mold 222 with a first bottom-mold height 224. Similarly, the package encapsulation 220 fills the second opening 106 forming a second bottom-mold 226 with a second bottom-mold height 228. The package encapsulation 220 partially covers the second device 114 providing the lowest package height for the stacked integrated circuit package-in-package system 100. For illustrative purposes, the package encapsulation 220 is described exposing the second device 114, although it is understood that the package encapsulation 220 may not expose the second device 114.

The first bottom-mold height 224 and the second bottom-mold height 228 is less than an external interconnect height 230 of the external interconnects 110. The first bottom-mold 222 and the second bottom-mold 226 do not impede the external interconnects 110 from further connections to the next system level (not shown), such as a printed circuit board or another integrated circuit package system.

The first device 112 and the second device 114 may be tested without assembly in the stacked integrated circuit package-in-package system 100 ensuring known good devices (KGD), increasing yield, and lowering cost. The offset configuration provides both the first terminals 210 and the second terminals 216 access to the substrate 102 for connections. The first opening 104 and the second opening 106 exploit the accessibility for connections to the bottom contacts 206. The connections to the bottom contacts 206 eliminate space required on the top surface 204 for wire loops of the first internal interconnects 212 and the second internal interconnects 218 as well as the top contacts 202 for those connections.

Figure 3:
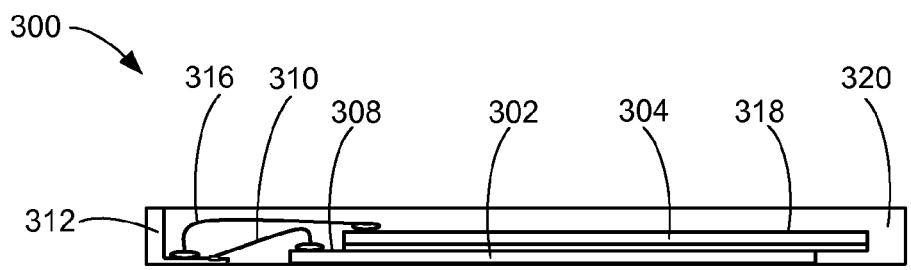
FIG. 3 is a cross-sectional view of a device in an embodiment of the present invention.

Referring now to FIG. 3, therein is shown a cross-sectional view of a device 300 in an embodiment of the present invention. The device 300 may represent or have similar structure to the first device 112 of FIG. 2 or the second device 114 of FIG. 2. The device 300 has a first integrated circuit die 302 below a second integrated circuit die 304 in an offset configuration. For illustrative purposes, the device 300 is described having the first integrated circuit die 302 and the second integrated circuit die 304, although it is understood that the device 300 may have other types of devices, such as passive devices or packaged devices.

The offset configuration exposes a portion of a first active side 308 of the first integrated circuit die 302. First interconnects 310, such as bond wires, connect between the first active side 308 and device terminals 312, such as terminal pads.

The second integrated circuit die 304 is over the first integrated circuit die 302 in an offset exposing the portion of the first active side 308. Second interconnects 316, such as bond wires, connect a second active side 318 of the second integrated circuit die 304 and the device terminals 312.

A device encapsulation 320, such as an epoxy mold compound, covers the first integrated circuit die 302, the second integrated circuit die 304, the first interconnects 310, and the second interconnects 316. The device encapsulation 320 partially covers the device terminals 312. The device terminals 312 are exposed at a side of the device 300.

Figure 4:
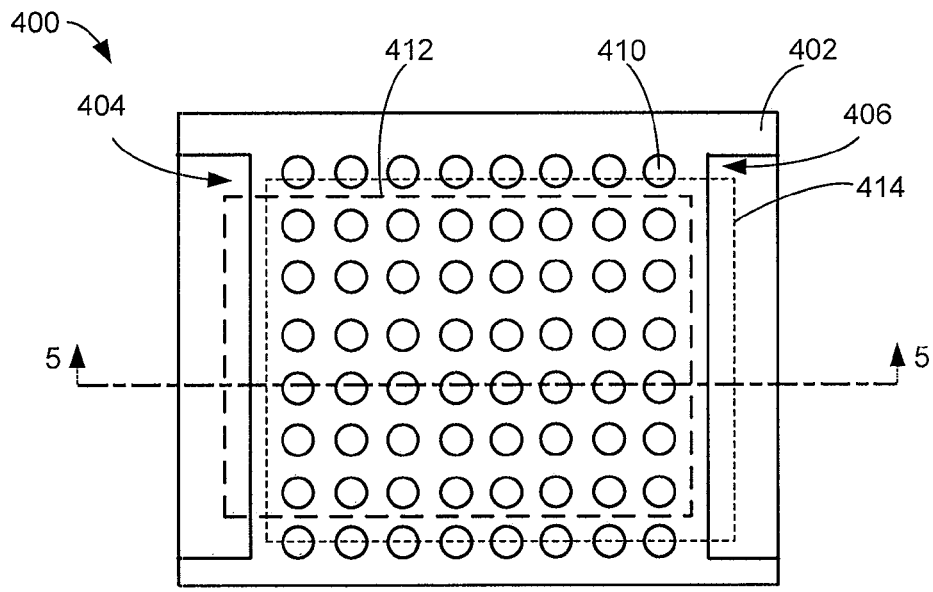
FIG. 4 is a plan view of a stacked integrated circuit package-in-package system in an alternative embodiment of the present invention.

Referring now to FIG. 4, therein is shown a plan view of a stacked integrated circuit package-in-package system 400 in an alternative embodiment of the present invention. The stacked integrated circuit package-in-package system 400 includes a substrate 402, such as a laminate substrate, with a first recess 404 and a second recess 406. An array of external interconnects 410, such as solder balls, are between the first recess 404 and the second recess 406 in the substrate 402.

A first device 412, such as a packaged device or an integrated circuit die, is over the first recess 404 and the array of the external interconnects 410. A second device 414, such as a packaged device or an integrated circuit die, is in an offset configuration with the first device 412. The second device 414 is over the second recess 406 and the array of the external interconnects 410.

For illustrative purposes, the first device 412 and the second device 414 are shown different sizes, although it is understood that the first device 412 and the second device 414 may not be different. Also for illustrative purposes, the first recess 404 and the second recess 406 are shown in the substrate 402, although it is understood that the number of recesses and the configurations of the recesses may differ. Further for illustrative purposes, the external interconnects 410 are shown in an array configuration, although it is understood that the external interconnects 410 may be in different configurations.

Figure 5:
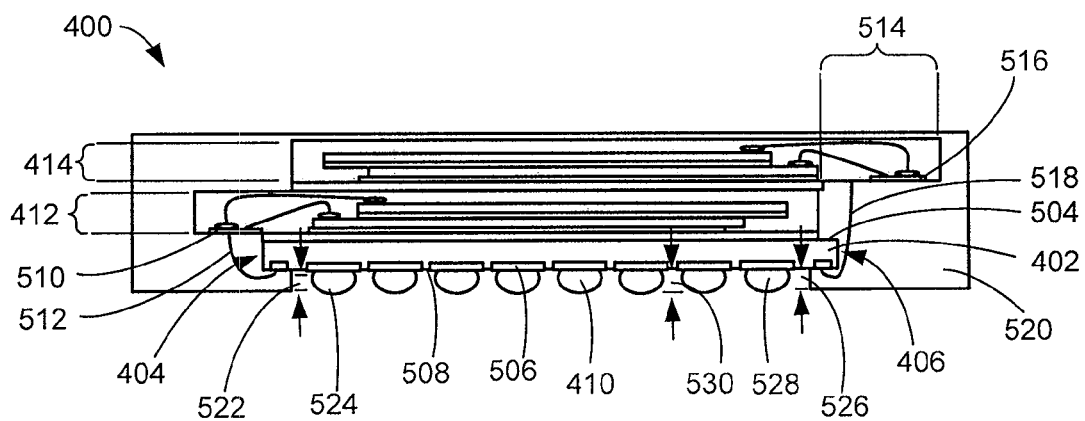
FIG. 5 is a cross-sectional view of the stacked integrated circuit package-in-package system along a line segment 5-5 of FIG. 4.

Referring now to FIG. 5, therein is shown a cross-sectional view of the stacked integrated circuit package-in-package system 400 along a line segment 5-5 of FIG. 4. The stacked integrated circuit package-in-package system 400 packs more devices while decreasing overall package size, simplifying manufacturing process, increasing yield, and reducing the overall cost through an offset stack configuration and a board on chip (BOC) configuration of the substrate 402.

The substrate 402 includes the first recess 404 and the second recess 406 in a BOC configuration. The substrate 402 has a top surface 504 and bottom contacts 506 at a bottom surface 508. The external interconnects 410 attach to a portion of the bottom contacts 506. For illustrative purposes, the substrate 402 is shown as having the bottom contacts 506, although it is understood that the substrate 402 may have other structures, such as one or more routing layers or electrical vias.

The first device 412 is over the top surface 504 and the first recess 404 while not covering the second recess 406. First terminals 510, such as terminal pads, of the first device 412 are over the first recess 404. First internal interconnects 512, such as bond wires, connect the first terminals 510 and the bottom contacts 506 next the first recess 404.

The second device 414 is stacked above the first device 412 in the offset configuration. The offset configuration provides an overhang 514 of the second device 414 over the first device 412. The overhang 514 exposes second terminals 516, such as terminal pads, of the second device 414. The overhang 514 provides a predetermined clearance from the first device 412 not to impede connections of second internal interconnects 518 to the second terminals 516. The second internal interconnects 518 also connect to the bottom contacts 506 next to the second recess 406.

A package encapsulation 520, such as an epoxy molding compound, covers the first device 412, the first internal interconnects 512, the second internal interconnects 518, and the top surface 504. The package encapsulation 520 also fills the first recess 404 forming a first bottom-mold 522 with a first bottom-mold height 524. Similarly, the package encapsulation 520 fills the second recess 406 forming a second bottom-mold 526 with a second bottom-mold height 528. The package encapsulation 520 partially covers the second device 414 providing the lowest package height for the stacked integrated circuit package-in-package system 400.

For illustrative purposes, the package encapsulation 520 is described exposing the second device 414, although it is understood that the package encapsulation 520 may not expose the second device 414. Also for illustrative purposes, the substrate 402 is shown with the first recess 404 and the second recess 406, although it is understood that the substrate 402 may not have the first recess 404 and the second recess 406 with the package encapsulation 520 forming the outline at opposite sides of the stacked integrated circuit package-in-package system 400.

The first bottom-mold height 524 and the second bottom-mold height 528 is less than an external interconnect height 530 of the external interconnects 410. The first bottom-mold 522 and the second bottom-mold 526 do not impede the external interconnects 410 from further connections to the next system level (not shown), such as a printed circuit board or another integrated circuit package system.

The first device 412 and the second device 414 may be tested without assembly in the stacked integrated circuit package-in-package system 400 ensuring known good devices (KGD), increasing yield, and lowering cost. The offset configuration provides both the first terminals 510 and the second terminals 516 access to the substrate 402 for connections. The first recess 404 and the second recess 406 exploit the accessibility for connections to the bottom contacts 506. The connections to the bottom contacts 506 eliminate space required on the top surface 504 for wire loops of the first internal interconnects 512 and the second internal interconnects 518 as well as connections to the top surface 504.

Figure 6:
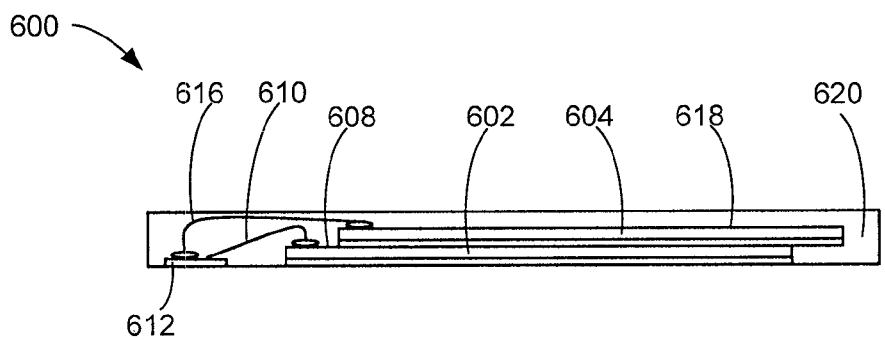
FIG. 6 is a cross-sectional view of a device in an alternative embodiment of the present invention.

Referring now to FIG. 6, therein is shown a cross-sectional view of a device 600 in an embodiment of the present invention. The device 600 may represent or have similar structure to the first device 412 of FIG. 5 or the second device 414 of FIG. 5. The device 600 has a first integrated circuit die 602 below a second integrated circuit die 604 in an offset configuration. For illustrative purposes, the device 600 is described having the first integrated circuit die 602 and the second integrated circuit die 604, although it is understood that the device 600 may have other types of devices, such as passive devices or packaged devices.

The offset configuration exposes a portion of a first active side 608 of the first integrated circuit die 602. First interconnects 610, such as bond wires, connect between the first active side 608 and device terminals 612, such as terminal pads.

The second integrated circuit die 604 is over the first integrated circuit die 602 in an offset exposing the portion of the first active side 608. Second interconnects 616, such as bond wires, connect a second active side 618 of the second integrated circuit die 604 and the device terminals 612.

A device encapsulation 620, such as an epoxy mold compound, covers the first integrated circuit die 602, the second integrated circuit die 604, the first interconnects 610, and the second interconnects 616. The device encapsulation 620 partially covers the device terminals 612. The device terminals 612 are exposed at a bottom of the device 600.

Figure 7:
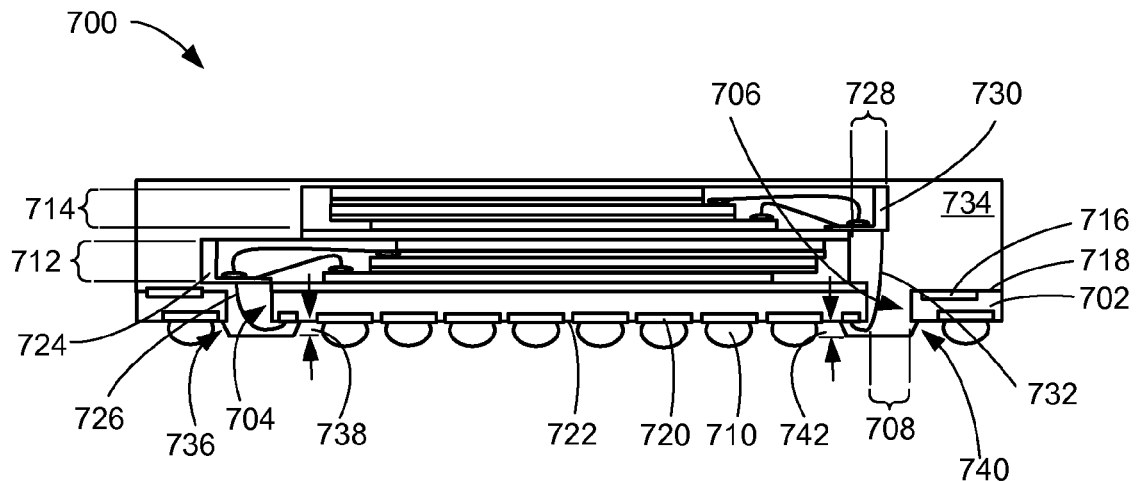
FIG. 7 is a cross-sectional view of a stacked integrated circuit package-in-package system along a line segment 2-2 of FIG. 1 in another alternative embodiment of the present invention.

Referring now to FIG. 7, therein is shown a cross-sectional view of a stacked integrated circuit package-in-package system 700 along a line segment 2-2 of FIG. 1 in another alternative embodiment of the present invention. The stacked integrated circuit package-in-package system 700 has a similar structure to the stacked integrated circuit package-in-package system 100 of FIG. 1.

A substrate 702 of the stacked integrated circuit package-in-package system 700 includes a first opening 704 and a second opening 706 in a BOC configuration. The first opening 704 and the second opening 706 has an opening width 708 in a range about hundreds to two thousand of micrometers. The substrate 702 includes top contacts 716 at a top surface 718 and bottom contacts 720 at a bottom surface 722. External interconnects 710 attach to a portion of the bottom contacts 720.

A first device 712 is over the top surface 718 and the first opening 704 while not covering the second opening 706. First terminals 724, such as terminal pads, of the first device 712 are over the first opening 704. First internal interconnects 726, such as bond wires, connect the first terminals 724 and the bottom contacts 720 next the first opening 704.

A second device 714 is stacked above the first device 712 in the offset configuration. The offset configuration provides an overhang 728 of the second device 714 over the first device 712. The overhang 728 exposes second terminals 730, such as terminal pads, of the second device 714. The overhang 728 provides a predetermined clearance from the first device 712 not to impede connections of second internal interconnects 732 to the second terminals 730. The second internal interconnects 732 also connect to the bottom contacts 720 next to the second opening 706.

A package encapsulation 734, such as an epoxy molding compound, covers the first device 712, the first internal interconnects 726, the second internal interconnects 732, and the top surface 718. The package encapsulation 734 also fills the first opening 704 forming a first bottom-mold 736 with a first bottom-mold height 738. Similarly, the package encapsulation 734 fills the second opening 706 forming a second bottom-mold 740 with a second bottom-mold height 742. The package encapsulation 734 partially covers the second device 714.

The first bottom-mold 736 and the second bottom-mold 740 do not impede the external interconnects 710 from further connections to the next system level (not shown), such as a printed circuit board or another integrated circuit package system.

Figure 8:
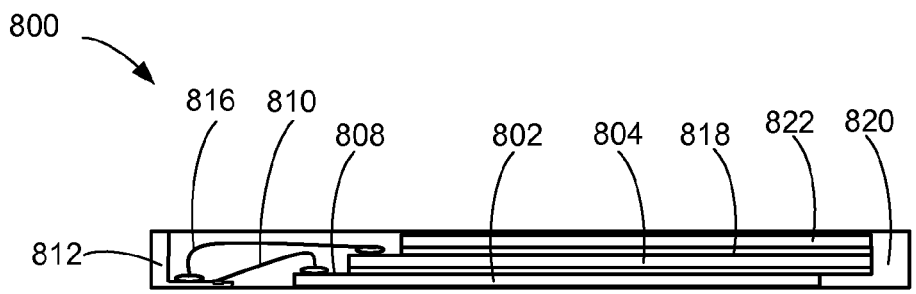
FIG. 8 is a cross-sectional view of a device in another alternative embodiment of the present invention.

Referring now to FIG. 8, therein is shown a cross-sectional view of a device 800 in another alternative embodiment of the present invention. The device 800 may represent or have similar structure to the first device 712 of FIG. 7 or the second device 714 of FIG. 7. The device 800 has a first integrated circuit die 802 below a second integrated circuit die 804 in an offset configuration. For illustrative purposes, the device 800 is described having the first integrated circuit die 802 and the second integrated circuit die 804, although it is understood that the device 800 may have other types of devices, such as passive devices or packaged devices.

The offset configuration exposes a portion of a first active side 808 of the first integrated circuit die 802. First interconnects 810, such as bond wires, connect between the first active side 808 and device terminals 812, such as terminal pads.

The second integrated circuit die 804 is over the first integrated circuit die 802 in an offset exposing the portion of the first active side 808. Second interconnects 816, such as bond wires, connect a second active side 818 of the second integrated circuit die 804 and the device terminals 812.

A stiffener 822, such as a dummy die or a heat spreader, is over the second active side 818 without impeding the connections of the second interconnects 816. The stiffener 822 provides additional planar rigidity mitigating or eliminating warpage of the device 800. The stiffener 822 may be optionally connected to a ground providing additional ground connection sites (not shown). The ground connection also allows the stiffener 822 to functions as an electromagnetic interference (EMI) shield.

A device encapsulation 820, such as an epoxy mold compound, covers the first integrated circuit die 802, the second integrated circuit die 804, the first interconnects 810, and the second interconnects 816. The device encapsulation 820 partially covers the device terminals 812 and the stiffener 822. The device terminals 812 are exposed at a side of the device 800 and a portion of a bottom of the device 800.

Figure 9:
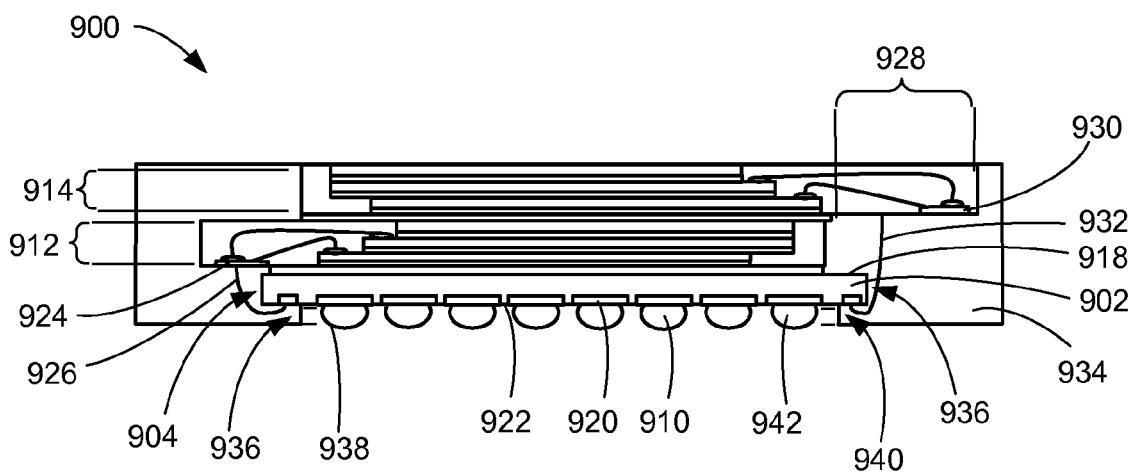
FIG. 9 is a cross-sectional view of a stacked integrated circuit package-in-package system along a line segment 5-5 of FIG. 4 in yet another alternative embodiment of the present invention.

Referring now to FIG. 9, therein is shown a cross-sectional view of a stacked integrated circuit package-in-package system 900 along a line segment 5-5 of FIG. 4 in yet another alternative embodiment of the present invention. The stacked integrated circuit package-in-package system 900 has a similar structure to the stacked integrated circuit package-in-package system 400 of FIG. 5.

A substrate 902 of the stacked integrated circuit package-in-package system 900 includes a first recess 904 and a second recess 906 in a BOC configuration. The substrate 902 includes a top surface 918 and bottom contacts 920 at a bottom surface 922. External interconnects 910 attach to a portion of the bottom contacts 920.

A first device 912 is over the top surface 918 and the first recess 904 while not covering the second recess 906. First terminals 924, such as terminal pads, of the first device 912 are over the first recess 904. First internal interconnects 926, such as bond wires, connect the first terminals 924 and the bottom contacts 920 next the first recess 904.

A second device 914 is stacked above the first device 912 in the offset configuration. The offset configuration provides an overhang 928 of the second device 914 over the first device 912. The overhang 928 exposes second terminals 930, such as terminal pads, of the second device 914. The overhang 928 provides a predetermined clearance from the first device 912 not to impede connections of second internal interconnects 932 to the second terminals 930. The second internal interconnects 932 also connect to the bottom contacts 920 next to the second recess 906.

A package encapsulation 934, such as an epoxy molding compound, covers the first device 912, the first internal interconnects 926, the second internal interconnects 932, and the top surface 918. The package encapsulation 934 also fills the first recess 904 forming a first bottom-mold 936 with a first bottom-mold height 938. Similarly, the package encapsulation 934 fills the second recess 906 forming a second bottom-mold 940 with a second bottom-mold height 942. The package encapsulation 934 partially covers the second device 914.

The first bottom-mold 936 and the second bottom-mold 940 do not impede the external interconnects 910 from further connections to the next system level (not shown), such as a printed circuit board or another integrated circuit package system.

Figure 10:
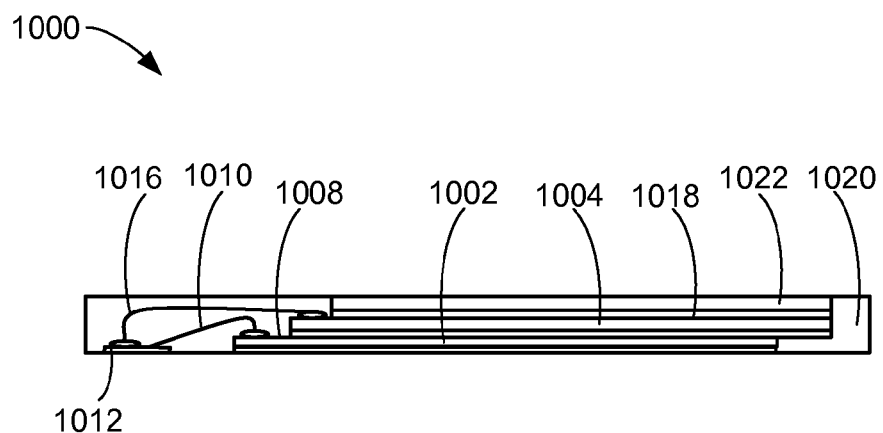
FIG. 10 is a cross-sectional view of a device in yet another alternative embodiment of the present invention.

Referring now to FIG. 10, therein is shown a cross-sectional view of a device 1000 in another alternative embodiment of the present invention. The device 1000 may represent or have similar structure to the first device 912 of FIG. 9 or the second device 914 of FIG. 9. The device 1000 has a first integrated circuit die 1002 below a second integrated circuit die 1004 in an offset configuration. For illustrative purposes, the device 1000 is described having the first integrated circuit die 1002 and the second integrated circuit die 1004, although it is understood that the device 1000 may have other types of devices, such as passive devices or packaged devices.

The offset configuration exposes a portion of a first active side 1008 of the first integrated circuit die 1002. First interconnects 1010, such as bond wires, connect between the first active side 1008 and device terminals 1012, such as terminal pads.

The second integrated circuit die 1004 is over the first integrated circuit die 1002 in an offset exposing the portion of the first active side 1008. Second interconnects 1016, such as bond wires, connect a second active side 1018 of the second integrated circuit die 1004 and the device terminals 1012.

A stiffener 1022, such as a dummy die or a heat spreader, is over the second active side 1018 without impeding the connections of the second interconnects 1016. The stiffener 1022 provides additional planar rigidity mitigating or eliminating warpage of the device 1000. The stiffener 1022 may be optionally connected to a ground providing additional ground connection sites (not shown). The ground connection also allows the stiffener 1022 to functions as an electromagnetic interference (EMI) shield.

A device encapsulation 1020, such as an epoxy mold compound, covers the first integrated circuit die 1002, the second integrated circuit die 1004, the first interconnects 1010, and the second interconnects 1016. The device encapsulation 1020 partially covers the device terminals 1012 and the stiffener 1022. The device terminals 1012 are exposed at a bottom of the device 1000.

Figure 11:
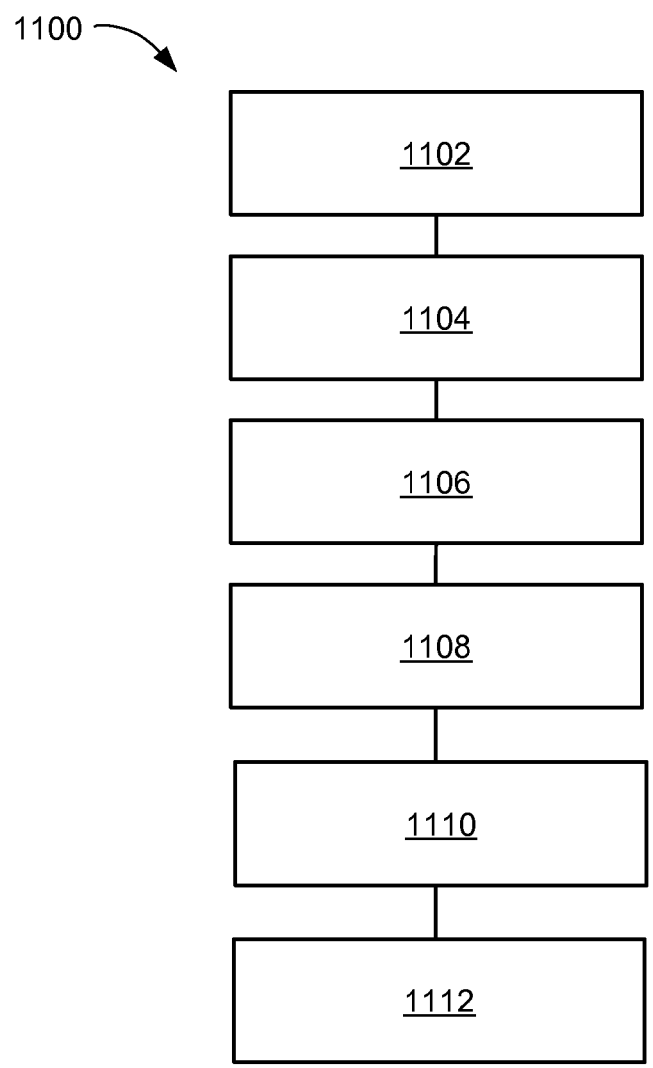
FIG. 11 is a flow chart of a stacked integrated circuit package-in-package system for manufacture of the stacked integrated circuit package-in-package system in an embodiment of the present invention.

Referring now to FIG. 11, therein is shown a flow chart of a stacked integrated circuit package-in-package system 1100 for manufacture of the stacked integrated circuit package-in-package system 100 in an embodiment of the present invention. The system 1100 includes forming a substrate having a top surface and a bottom surface in a block 1102; mounting a first device over the top surface in a block 1104; stacking a second device over the first device in an offset configuration in a block 1106; connecting a first internal interconnect between the first device and the bottom surface in a block 1108; connecting a second internal interconnect between the second device and the bottom surface in a block 1110; and encapsulating the first device and the second device in a block 1112.

It has been discovered that the present invention thus has numerous aspects.

A principle aspect that has been unexpectedly discovered is that the present invention provides a stacked integrated circuit package-in-package system having BOC and stacked offset configurations with decreased over size, improved thermal performance, improved EMI performance, and improved reliability performance.

Another aspect is that the present invention provides device connections to the substrate through openings or recesses in the substrate. This decreases the lateral dimensions of the package by eliminating the space normally required for wire loops and contacts on a top surface of the substrate.

Yet another aspect of the present invention provides an offset configuration of the devices such that the terminals for the stacked devices are not impeded and accessible for capillary wire connections through the openings.

Yet another aspect of the present invention provides an EMI shield between the stacked devices and for the overall stacked package-in-package device.

Yet another aspect of the present invention provides improved yield of the overall stacked package-in-package device. The stacked devices in the stacked package-in-package device may be tested ensuring known good device before assembly of the stacked package-in-package device.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the stacked integrated circuit package-in-package system of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

Thus, it has been discovered that the stacked integrated circuit package-in-package system method of the present invention furnishes important and heretofore unknown and unavailable solutions, capabilities, and functional aspects for improving thermal performance, reducing EMI, and reliability in systems. The resulting processes and configurations are straightforward, cost-effective, uncomplicated, highly versatile, and effective, can be implemented by adapting known technologies, and are thus readily suited for efficiently and economically manufacturing integrated circuit package devices.

What is claimed is:

1. A stacked integrated circuit package-in-package system comprising:
    forming a substrate having a top surface, a bottom surface, a first recess, and a second recess;
    mounting a first device over the top surface;
    stacking a second device over the first device in an offset configuration;
    connecting a first internal interconnect between the first device and the bottom surface with the first internal interconnect around the first recess;
    connecting a second internal interconnect between the second device and the bottom surface with the second internal interconnect around the second recess; and
    encapsulating the first device and the second device.
2. The system as claimed in claim 1 wherein:
    forming the substrate includes:

forming a first opening and a second opening in the substrate;
connecting the first internal interconnect between the first device and the bottom surface also includes:
  connecting the first device and the bottom surface with the first internal interconnect through the first opening; and
connecting the second internal interconnect between the second device and the bottom surface further includes:
  connecting the second device and the bottom surface with the second internal interconnect through the second opening.

3. The system as claimed in claim 1 further comprising forming the first device having a first integrated circuit die in a device encapsulation.

4. The system as claimed in claim 1 further comprising forming the first device having a stiffener in a device encapsulation.

5. A stacked integrated circuit package-in-package system comprising:
  forming a laminate substrate having a top surface, a bottom surface with a bottom contact at the bottom surface, a first recess, and a second recess;
  mounting a first device having a first integrated circuit die over the top surface;
  stacking a second device having a second integrated circuit die over the first device in an offset configuration;
  connecting a first internal interconnect between the first device and the bottom contact;
  connecting a second internal interconnect between the second device and the bottom contact; and
  encapsulating the first device, the second device, the first recess, and the second recess over the top surface.

6. The system as claimed in claim 5 wherein:
  forming the laminate substrate includes:
    forming a first opening and a second opening in the laminate substrate; and
  encapsulating the first device and the second device also includes:
    filling the first opening, and the second opening.

7. The system as claimed in claim 5 further comprising attaching an external interconnect to the bottom contact.

8. The system as claimed in claim 5 wherein forming the laminate substrate includes forming a first opening and a second opening having an opening width ranging from hundreds to two thousand of micrometers in the laminate substrate.

9. A stacked integrated circuit package-in-package system comprising:
  a substrate having a top surface, a bottom surface, a first recess, and a second recess;
  a first device over the top surface;
  a second device over the first device in an offset configuration;
  a first internal interconnect between the first device and the bottom surface with the first internal interconnect around the first recess;
  a second internal interconnect between the second device and the bottom surface with the second internal interconnect around the second recess; and
  a package encapsulation to cover the first device and the second device.

10. The system as claimed in claim 9 wherein:
  the substrate has a first opening and a second opening;
  the first internal interconnect is in the first opening; and
  the second internal interconnect is in the second opening.

11. The system as claimed in claim 9 wherein the first device has a first integrated circuit die in a device encapsulation.

12. The system as claimed in claim 9 wherein the first device has a stiffener in a device encapsulation.

13. The system as claimed in claim 9 wherein:
  the substrate is a laminate substrate having the top surface and the bottom surface with the bottom surface having a bottom contact;
  the first device has a first integrated circuit die over the top surface;
  the second device has a second integrated circuit die over the first device in an offset configuration;
  the first internal interconnect is a bond wire between the first device with the bottom contact;
  the second internal interconnect is the bond wire between the second device with the bottom contact; and
  the package encapsulation is a cover for the first device, the second device, and the top surface.

14. The system as claimed in claim 13 wherein:
  the laminate substrate has a first opening and a second opening; and
  the package encapsulation is in the first opening, and the second opening.

15. The system as claimed in claim 13 wherein:
  the laminate substrate has a first recess and a second recess; and
  the package encapsulation is in the first recess, and the second recess.

16. The system as claimed in claim 13 further comprising an external interconnect attached to the bottom contact.

17. The system as claimed in claim 13 wherein the laminate substrate has a first opening and a second opening having an opening width ranging from hundreds to two thousand of micrometers.

* * * * *